United States Patent
O'Neill et al.

[11] Patent Number: 5,309,110
[45] Date of Patent: May 3, 1994

[54] DIFFERENTIAL DIELECTRIC ANALYZER

[75] Inventors: Michael J. O'Neill, Ridgefield; Kerry McKinley, New Fairfield, both of Conn.

[73] Assignee: The Perkin Elmer Corporation, Norwalk, Conn.

[21] Appl. No.: 845,994

[22] Filed: Mar. 4, 1992

[51] Int. Cl.[5] .......................................... G01R 27/26
[52] U.S. Cl. .................... 324/674; 324/650; 324/663; 324/671; 324/681
[58] Field of Search ............... 324/649, 650, 651, 662, 324/663, 671, 674, 681, 683, 685, 686, 690

[56] References Cited

U.S. PATENT DOCUMENTS

| | | | |
|---|---|---|---|
| 3,879,660 | 4/1975 | Piso | 324/63 |
| 4,584,885 | 4/1986 | Cadwell | 324/683 X |
| 5,065,106 | 11/1991 | Hendrick et al. | 324/663 |
| 5,122,754 | 6/1992 | Gotaas | 324/671 X |

Primary Examiner—Kenneth A. Wieder
Assistant Examiner—Glenn W. Brown
Attorney, Agent, or Firm—John R. Wahl; Edwin T. Grimes

[57] ABSTRACT

An apparatus for analyzing the dielectric properties of a sample. A thin planar sample having a hole therein is positioned over two bottom electrodes having the hole over one of the bottom electrodes. An oscillator provides a first signal to one of the bottom electrodes and a second signal 180° out of phase with the first signal to the second bottom electrode. A differential signal is obtained on the top electrode representative of the dielectric properties of the sample with the elimination of edge effects. A phase sensitive demodulator synchronized with the oscillator extracts the two components of the conductance and susceptance of the sample. A position sensor measures the thickness of the sample and is used to calculate the dielectric constant of the sample. Thereby, an accurate measurement of the dielectric properties of the sample is obtained without a complicated structure in order to eliminate edge effects.

14 Claims, 1 Drawing Sheet

DIFFERENTIAL DIELECTRIC ANALYZER

FIELD OF THE INVENTION

The present invention relates generally to an apparatus for analyzing the dielectric properties of a sample, and more particularly to an apparatus for differentially determining the dielectric properties of a sample.

BACKGROUND OF THE INVENTION

Many devices have been used to determine the dielectric properties of materials. However, many of these devices use complicated geometries that are difficult to maintain and use accurately. Some devices use a parallel plate geometry. However, parallel plate geometry devices suffer from end effects which require complex shielding and guard rings. Even with the complex shielding and guard rings, the accuracy of the device is compromised. Additionally, generally large samples are needed. The use of the large samples is inconvenient, and additionally limits the ability to accurately control the temperature of the sample during measurement.

Therefore, there is a need for an improved, more accurate device for analyzing the dielectric properties of a sample.

SUMMARY OF THE INVENTION

The present invention comprises an apparatus having a parallel plate geometry for measuring dielectric properties of a sample. One of the parallel plates has a first and second electrode that are independently driven out of phase with respect to each other. The first electrode is positioned over a hole within a sample that is to be analyzed. The second electrode is positioned over a continuous portion of the sample. When the first and second electrodes are driven by an oscillator 180° out of phase, the current produced by the top electrode plate is the vector sum of the differential conductance component and the differential susceptance component. These two components are recovered by a phase sensitive demodulator using reference signals in phase and 90° out of phase with the oscillator applied voltages. The resulting conductance and susceptance are directly proportional to the conductance and capacitance of the sample. The susceptance component of the signal is used together with the thickness and diameter of the hole in the sample to determine the dielectric constant of the sample.

Therefore, it is an object of the present invention to eliminate edge effects in measuring dielectric properties of a sample.

It is a advantage of the present invention that relatively small sample size can be used.

It is another advantage of the present invention that the structure is relatively simple.

It is a feature of the present invention that on of the parallel electrode plates has two independent electrode portions that are driven out of phase with respect to each other.

These and other objects, advantages, and features will become readily apparent in view of the following more detailed description.

BRIEF DESCRIPTION OF THE DRAWINGS

The figure is a schematic representation of the present invention.

DETAILED DESCRIPTION OF THE PREFERRED EMBODIMENTS

Figure 1:
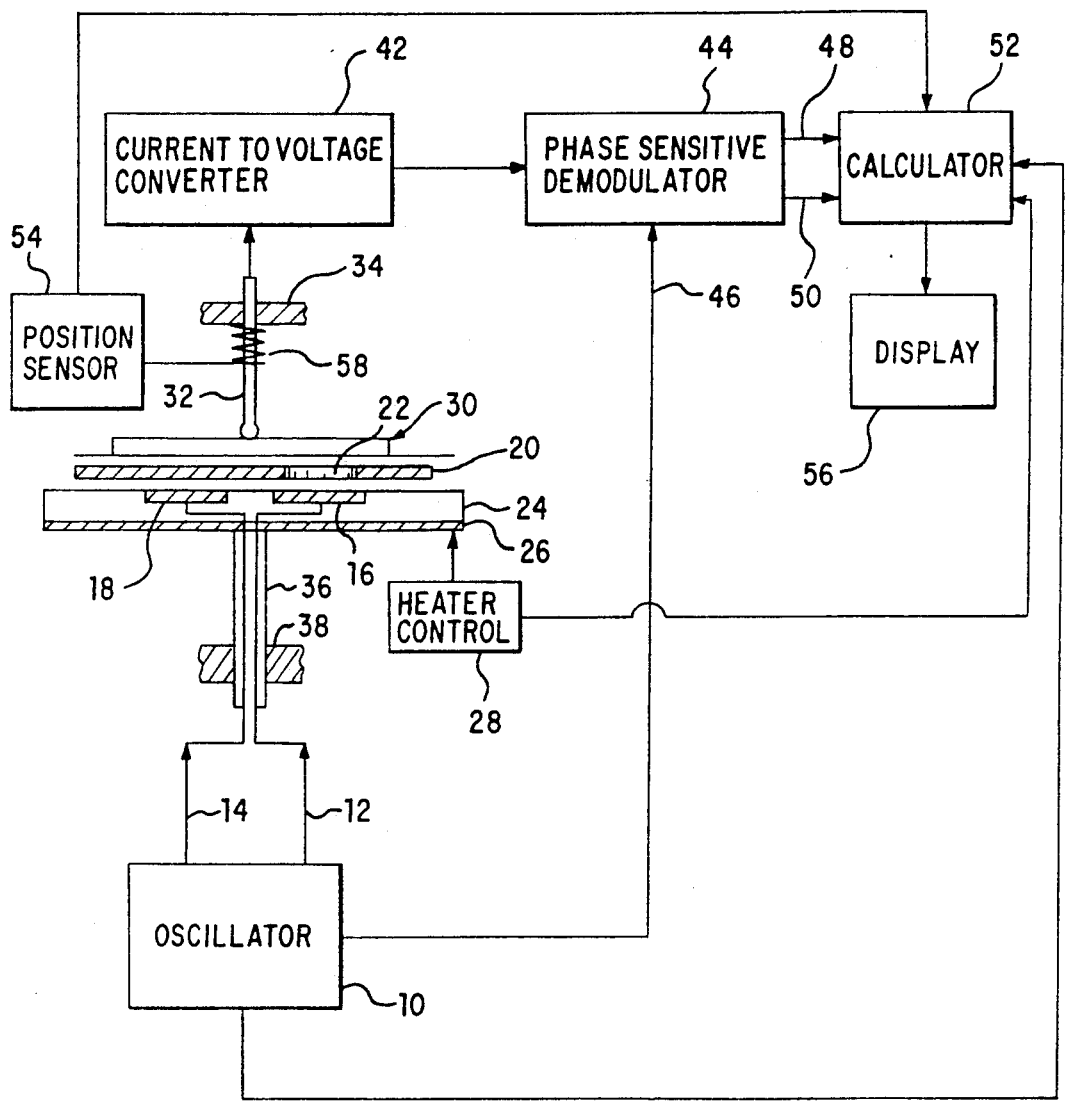

The figure is a schematic representation of the preferred embodiment of the present invention. An oscillator 10 has a first AC sinusoidal output signal 12 and a second AC sinusoidal output signal 14. The second output signal 14 is 180° out of phase with the first output signal 12. The first output signal 12 is coupled to a first bottom electrode 16. The second output signal 14 is coupled to a second bottom electrode 18. The first and second bottom electrodes 16 and 18 are attached to a substrate 24. The substrate 24 can be made of any insulating material, but preferably is made of beryllia to reduce horizontal temperature gradients. Attached to the substrate 24 is a heating element 26 which is controlled by heater control means 28. The heater control means 28 controls the temperature of the substrate 24 when dielectric parameters are desired as a function of temperature. The substrate 24 is supported by bottom substrate support 36, which is held in position by a bottom substrate support guide 38. Opposite the first and second bottom electrodes 16 and 18 is a top electrode 30. A top electrode contact 32 is connected to a current to voltage converter means 42. The current to voltage converter means 42 is coupled to a phase sensitive demodulator means 44. The phase sensitive demodulator means 44 is provided a synchronizing signal 46 from the oscillator 10. The synchronizing signal 46 provides a signal that is in phase with the first output signal 12 of the oscillator 10, and another signal that is 90° out of phase with the first output signal 12.

Two signals are output from the phase sensitive demodulator means 44. The first signal 48 is proportional to the conductance of a sample 20 less the conductance of an air gap formed by a hole 22 in the sample 20, the hole 22 being positioned between the first bottom electrode 16 and the top electrode 30. The conductance of the air gap formed by the hole 22 is usually negligible. The second signal 50 is proportional to the susceptance of the sample 20 less the susceptance of the air gap formed by the hole 22. The two signals 48 and 50 are input to a calculator means 52 in order to determine various dielectric parameters of the sample, namely the conductance, the susceptance, the dielectric constant, and tan δ.

In order to calculate the dielectric constant of the sample, the thickness of the sample is needed. The thickness of the sample is provided to the calculator means 52 by a position sensor means 54 coupled to the top electrode contact 32. The top electrode 30 and top electrode contact 32 are movable in the vertical direction in order to permit the positioning of a sample 20 between the top electrode 30 and first and second bottom electrodes 16 and 18. A spring 58 is used to bias the top electrode 30 into contact with the sample 20. The top electrode support 34 is used to guide the top electrode contact 32. The position sensor means 54 can be any electrical or mechanical sensor, such as an LVDT, that can accurately determine the change in vertical position of the electrical contact 32. The thickness of the sample can then easily be determined from the change in vertical position from closed to when the sample is inserted between the first and second bottom electrodes 16 and 18 and the top electrode 30. Upon completion of the calculation of the various parameters desired by the calculator means 52, the desired parameters are displayed on display 56.

The operation of the device can now be readily understood with reference to the Figure. A thin, flat sample 20 is placed between the top electrode 30 and substrate 24. The sample is typically a thin, flat material for which the dielectric properties are desired. The sample thickness typically ranges between 0.001 and 0.020 inches. The diameter of the sample is typically 1 inch. Within one portion of the sample, a hole 22 is punched. The hole of the sample is positioned over one of the first or second bottom electrodes 16 and 18. The diameter of hole 22 should be less than the diameter of either the first or second bottom electrodes 16 or 18. The top surface area or diameter of the first and second bottom electrodes 16 and 18 are preferably identical. The bottom surface area of electrode 30 is preferably at least as large as the combined top surface area of the first and second bottom electrodes 16 and 18. The sample 20 should extend beyond the outer edge of the top electrode 30. The sample 20 can easily be inserted between the top electrode 30 and the first and second bottom electrodes 16 and 18 by raising the top electrode 30. Alternatively, the substrate 24 can be made movable with the top electrode 30 remaining fixed.

The oscillator 10 produces a periodic or sinusoidal voltage to drive the first and second bottom electrodes 16 and 18. The oscillator typically has a frequency range of between 0.001 Hz and 100 kHz and a voltage ranging between 0 and 20 volts peak to peak.

The second bottom electrode 18, being driven 180° out of phase with the first bottom electrode 16 results in a differential signal being induced equivalent to a sample the size of hole 22 with no edge effects. This results in a much better representation of the dielectric properties of the sample 20. The induced current is conducted by top electrode contact 32 to the current to voltage converter means 42. The currents generated being relatively low are difficult to process and are therefore converted to a voltage. The voltage from the current to voltage converter means 42 is then fed into a phase sensitive demodulator means 44. The phase sensitive demodulator means 44 being synchronized by the synchronizing signal 46 from the oscillator 10 with a signal that is in phase with the first output signal 12 of the oscillator 10 and a signal that is 90° out of phase relative to the first output signal 12 of oscillator 10. Thereby, the signal entering the phase sensitive demodulator means 44 can be demodulated into two signals representative or proportional to the difference between the conductance and susceptance of the sample and the conductance and susceptance of the air gap formed by the hole 22. The susceptance component being 90° out of phase with the conductance component. The conductance component is in phase with the first output signal 12 of the oscillator 10. The differential susceptance component of the signal is given by the following equation:

$$\omega\Delta c = \omega\epsilon_o(k - 1)\frac{A}{d}$$

where
$\epsilon_o$ is the permittivity of free space,
k is the dielectric constant of the sample,
A is the area of the hole in the sample,
d is the thickness of the sample.

Therefore, the only unknown in order to determine the dielectric constant k is the thickness d of the sample. This thickness d is obtained by position sensor means 54 or can be manually measured and provided to calculator means 52.

Heater control means 28 and heater element 26 are provided to permit the dielectric parameters of a sample to be plotted as a function of temperature. To assist in avoiding temperature gradients within the sample, the sample and fixture can be held at reduced pressure. Additionally, the oscillator 10 has a variable frequency range, typically between 0.001 Hz and 100 kHz to permit plotting of the dielectric properties as a function of frequency.

Although the preferred embodiment has been illustrated and described, it will be obvious to those skilled in the art that various modifications may be made without departing from the spirit and scope of this invention.

What is claimed:

1. An apparatus for analyzing the dielectric properties of a sample comprising:
   a substrate;
   a first bottom electrode mounted on said substrate;
   a second bottom electrode mounted on said substrate;
   a top electrode;
   oscillator means, coupled to said first and second bottom electrodes, for driving said first and second bottom electrodes, said second electrode being driven out of phase relative to said first electrode;
   demodulator means, coupled to said top electrode, for extracting a signal representative of the conductance of the sample and a signal representative of the susceptance of the sample;
   calculator means, coupled to said oscillator means and said demodulator means, for calculating desired dielectric properties of the sample; and
   display means, coupled to said calculator means, for displaying desired dielectric properties of the sample.

2. An apparatus for analyzing the dielectric properties of a sample as in claim 1 wherein:
   said second electrode is driven 180° out of phase relative to said first electrode.

3. An apparatus for analyzing the dielectric properties of a sample as in claim 2 wherein:
   said first and second bottom electrodes have equal surface areas.

4. An apparatus for analyzing the dielectric properties of a sample as in claim 1 wherein:
   the surface area of said top electrode is at least as large as the combined surface areas of said first and second bottom electrodes.

5. An apparatus for analyzing the dielectric properties of a sample as in claim 1 wherein:
   said oscillator means is variable.

6. An apparatus for analyzing the dielectric properties of a sample as in claim 5 wherein:
   said oscillator means has a variable frequency range between 0.001 Hz and 100 kHz.

7. An apparatus for analyzing the dielectric properties of a sample as in claim 6 wherein:
   said calculator means further comprises means for calculating the dielectric properties of the sample as a function of frequency.

8. An apparatus for analyzing the dielectric properties of a sample as in claim 1 further comprising:
   position sensor means, associated with either said top electrode or said substrate, for determining the thickness of the sample placed therebetween.

9. An apparatus for analyzing the dielectric properties of a sample as in claim 8 wherein:

said calculator means further comprises means for calculating the dielectric constant of the sample.

10. An apparatus for analyzing the dielectric properties of a sample comprising:
a substrate;
a first bottom electrode mounted on said substrate;
a second bottom electrode mounted on said substrate;
a top electrode;
oscillator means, coupled to said first and second bottom electrodes, for driving said first and second bottom electrodes, said second electrode being driven out of phase relative to said first electrode;
demodulator means, coupled to said top electrode, for extracting a signal representative of the conductance of the sample and a signal representative of the susceptance of the sample;
calculator means, coupled to said oscillator means and said demodulator means, for calculating desired dielectric properties of the sample;
display means, coupled to said calculator means, for displaying desired dielectric properties of the sample; and
heater means, coupled to said substrate, for heating the sample over a range of temperatures.

11. An apparatus for analyzing dielectric properties comprising:
a substrate;
a first bottom electrode mounted on said substrate;
a second bottom electrode mounted on said substrate adjacent said first bottom electrode, said second bottom electrode having a top surface area equal to a top surface area of said first bottom electrode;
a top electrode positioned above said first and second bottom electrodes having a bottom surface area at least as large as the combined top surface areas of said first and second bottom electrode;
a planar sample to be analyzed, said sample having a hole therein, said sample positioned between said top electrode and said first and second bottom electrodes such that the hole is positioned completely over one of said first or second bottom electrodes;
oscillator means, coupled to said first and second bottom electrodes, for applying a first signal to said first bottom electrode, and a second signal 180° out of phase with said first signal to said second bottom electrode; and
phase sensitive demodulator means, coupled to said top electrode and said oscillator means, for obtaining a first component in phase with said first signal representative of the conductance of said sample and a second component 90° out of phase with said first signal representative of the susceptance of the sample.

12. An apparatus for analyzing dielectric properties as in claim 11 further comprising:
position sensor means, coupled either to said top electrode or said substrate for determining the thickness of said sample; and
calculator means, coupled to said position sensor means and said phase sensitive demodulator means, for calculating the dielectric constant of said sample.

13. An apparatus for analyzing dielectric properties as in claim 12 further comprising:
a heater element attached to said substrate; and
heater control means, coupled to said heater element and said calculator means, for controlling the temperature of said sample.

14. An apparatus for analyzing dielectric properties as in claim 13 further comprising:
display means, coupled to said calculator means, for displaying selected dielectric properties of said sample.

* * * * *